United States Patent [19]

Gigliotti, Jr. et al.

[11] Patent Number: 4,522,664
[45] Date of Patent: Jun. 11, 1985

[54] PHASE STABLE CARBIDE REINFORCED NICKEL-BASE SUPERALLOY EUTECTICS HAVING IMPROVED HIGH TEMPERATURE STRESS-RUPTURE STRENGTH AND IMPROVED RESISTANCE TO SURFACE CARBIDE FORMATION

[75] Inventors: Michael F. X. Gigliotti, Jr., Scotia; Swe-Wong Yang, Clifton Park; Melvin R. Jackson, Schenectady, all of N.Y.; Charles A. Bruch, Cincinnati, Ohio; Xuan Nguyen-Dinh, Chandler, Ariz.

[73] Assignee: General Electric Company, Schenectady, N.Y.

[21] Appl. No.: 481,617

[22] Filed: Apr. 4, 1983

[51] Int. Cl.$^3$ .......................................... C22C 19/03
[52] U.S. Cl. ................................. 148/404; 148/409; 148/410
[58] Field of Search ........ 148/404, 409, 410, 426–429; 420/448, 441, 442, 445, 447, 451, 460

[56] References Cited

U.S. PATENT DOCUMENTS 4,292,076  9/1981  Gigliotti et al. .................. 148/404

Primary Examiner—R. Dean
Attorney, Agent, or Firm—Paul E. Rochford; James C. Davis, Jr.; James Magee, Jr.

[57] ABSTRACT

Monocarbide reinforced nickel-base eutectic superalloys which are substantially phase stable and have improved high temperature stress-rupture strength with improved resistance to the formation of surface nucleated carbides are provided. These superalloys are especially suited for making unidirectionally solidified anisotropic metallic bodies in the form of vanes and rotating blades for aircraft gas turbine engines.

6 Claims, 5 Drawing Figures

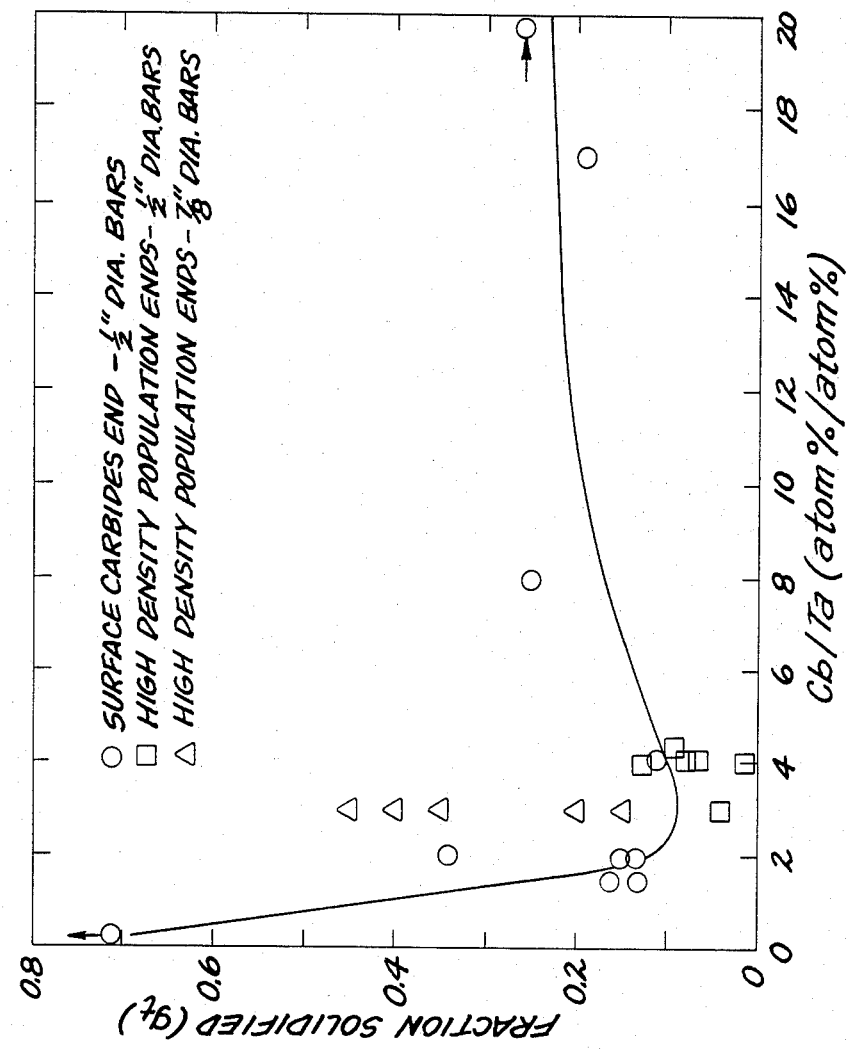
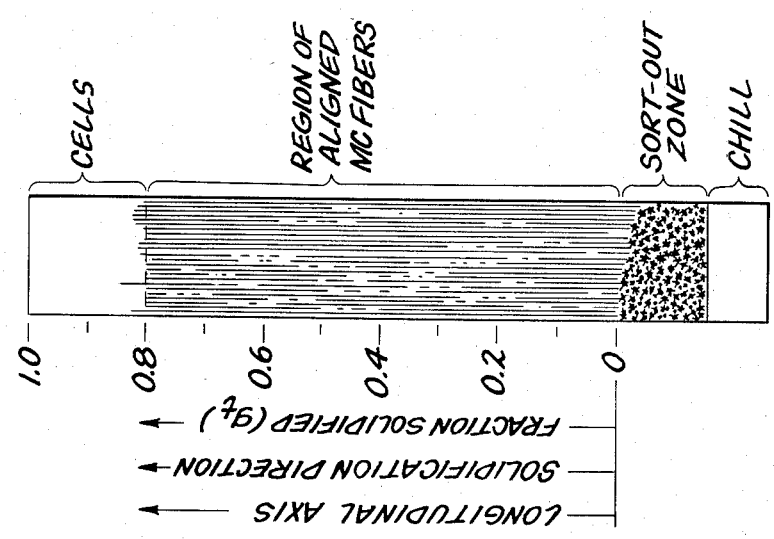

PHASE STABLE CARBIDE REINFORCED NICKEL-BASE SUPERALLOY EUTECTICS HAVING IMPROVED HIGH TEMPERATURE STRESS-RUPTURE STRENGTH AND IMPROVED RESISTANCE TO SURFACE CARBIDE FORMATION

CROSS-REFERENCE TO RELATED APPLICATION

The invention herein is related to the invention disclosed and claimed in U.S. patent application Ser. No. 421,634 which was filed on Sept. 22, 1982, is assigned to the same assignee as the instant invention and is herein incorporated by reference.

BACKGROUND OF THE INVENTION

1. Field of the Invention

This invention pertains generally to nickel-base superalloys which are capable of being undirectionally solidified to form articles of manufacture having a composite microstructure of an aligned fibrous monocarbide eutectic reinforcing phase embedded in a nickel-base superalloy matrix. More particularly, this invention pertains to monocarbide reinforced nickel-base superalloy eutectics which are substantially phase stable and have improved high temperature stress-rupture strength with improved resistance to the formation of surface nucleated carbides during unidirectional solidification.

2. Description of the Prior Art

Monocarbide reinforced nickel-base superalloy eutectics of the predominantly TaC reinforced type described, for example, in U.S. Pat. Nos. 3,904,402, 4,284,430 and 4,292,076 to Smashey, Henry and Gigliotti, Jr., et al. respectively, which are herein incorporated by reference, are primarily designed for use as unidirectionally solidified anisotropic metallic bodies in the form of vanes and rotating blades in aircraft gas turbine engines. Such aircraft engines present operating environments which require, for example, cyclic oxidation resistance, hot corrosion resistance, and high strength at high temperatures for such parts as vanes and rotating blades.

An undesirable feature of many monocarbide reinforced eutectic superalloys, including the preferred and more preferred alloys of U.S. Pat. Nos. 4,284,430 and 4,292,076, is the propensity for formation of microstructural instabilities after long-time exposure at elevated temperatures. Microstructural instabilities are platelet-like or globular precipitates of phases, i.e., $M_6C$ or $\sigma$, which result from a reaction between elements in the superalloy matrix, notably tungsten ad molybdenum, and the tantalum carbide fibers or whiskers. The precipitated phase is considered undesirable since it has the potential to decrease strength by depleting the matrix of strengthening elements, is a potential site for early crack initiation in its platelet-like morphology, and is a potential site for early onset of oxidation due to its low aluminum and high refractory metal content.

Another undesirable feature of such eutectic superalloys, particularly in the form of hollow air cooled airfoil castings, is the presence of blocky, surface nucleated carbides. In such superalloys, those carbides form an essentially continuous film on all cast surfaces, and extend to a depth typically of about 6 miils (150$\mu$) into the casting. Nucleation of such carbides on mold or core walls occurs in the liquid ahead of the advancing solidification growth front during unidirectional solidification. Surface carbide dimensions depend on the temperature gradient in the liquid and the growth (solidification) rates, since those carbides continue to grow until the advancing front consumes all the liquid available to the carbide. Those surface nucleated carbides are undesirable in that they reduce strength, i.e., in some thin-wall hollow airfoil sections those carbides can reduce load-bearing area by 40%. Furthermore, those carbides can act as crack nucleation sites, thus detrimentally affecting fatigue life and resistance to failure by stress-rupture. Normally, such surface carbides must be removed by expensive mechanical machining processes in order to render the castings suitable for end use in aircraft gas turbine engines.

While the alloys of U.S. Pat. Nos. 4,284,430 and 4,292,076 are prone to the routine formation of large amounts of surface nucleated carbides, others, such as the alloys of U.S. Pat. No. 3,904,402, are not. There are a great many differences in composition among those alloys. The elements whose amounts vary greatly among those alloys are Ta, V, Mo, W and Cr. For example, the alloys of U.S. Pat. Nos. 4,284,430 and 4,292,076 contain Mo, large amounts of Ta and no V while the alloys of U.S. Pat. No. 3,904,402 contain V, lesser amounts of Ta and no Mo. Additionally, it is known that TiC and CbC reinforced eutectic alloys are also prone to the formation of large amounts of surface nucleated carbides.

Thus, although the eutectic superalloys described above represent significant advances in the metallurgical arts, there is room for further improvement. Specifically desirable would be eutectic superalloys which are phase stable and have improved resistance to the formation of surface nucleated carbides, but which also have sufficient transverse ductility, cyclic oxidation resistance, hot corrosion resistance and high temperature strength properties, including stress-rupture strength, to render them acceptable for use in aggressive environments, especially those found in aircraft gas turbine engines.

SUMMARY OF THE INVENTION

There is provided by the invention herein described monocarbide reinforced eutectic superalloys which are substantially phase stable and have improved high temperature, i.e., about 1900° F. and higher, stress-rupture strength with improved resistance to the formation of surface nucleated carbides. These novel superalloys are capable of developing in a unidirectionally solidified anisotropic article of manufacture a microstructure comprising a nickel-base superalloy matrix with an aligned fibrous monocarbide eutectic reinforcing phase embedded in the matrix. The principal articles contemplated are vanes and rotating blades for use in aircraft gas turbine engines. The novel superalloys of this invention have the properties, e.g., resistance to cyclic oxidation and hot corrosion, and strength at high temperatures, required of such articles operating in aggressive environments such as those found in aircraft gas turbine engines.

The superalloys of this invention can be viewed as having a partial substitution of Cb for Ta compared to the alloys of U.S. Pat. No. 4,292,076. Thus, the rupture strengths of the superalloys of this invention are equal to or higher than those of the '076 patent on an absolute basis and, due to the lower atomic weight of Cb compared to Ta, are greater on a specific basis, i.e., have greater strength/weight ratios.

Broadly, the superalloys of the invention consist essentially of tantalum, columbium and carbon; one or more elements selected from the grop consisting of chromium, aluminum, cobalt, tungsten, molybdenum, rhenium, vanadium, hafnium and zirconium; boron in an amount greater than an impurity amount up to about 0.05%, the balance being nickel and incidental impurities, subject to the provisos that, by weight percent, $$3.4 \leq \Sigma(Mo+W) \leq 10.4 \tag{a}$$

and $$1 \leq (Cb/Ta) \leq 4.5 \tag{b}$$

Similarly, the invention also provides unidirectionally solidified anisotropic composite articles of manufacture having improved high temperature stress-rupture strength with improved resistance to the formation of surface nucleated carbides comprising:

(a) a nickel-base superalloy matrix and
(b) an aligned fibrous monocarbide eutectic reinforcing phase embedded in the matrix, the article being of a substantially phase stable alloy consisting essentially of tantalum, columbium and carbon; one or more elements selected from the group consisting of chromium, aluminum, cobalt, tungsten, molybdenum, rhenium, vanadium, hafnium, and zirconium; boron in an amount greater than an impurity amount up to about 0.05%, the balance being essentially nickel and incidental impurities, subject to the proviso that, by weight percent, $$3.4 \leq \Sigma(Mo+W) \leq 10.4 \tag{i}$$

and $$1 \leq (Cb/Ta) \leq 4.5. \tag{ii}$$

BRIEF DESCRIPTION OF THE DRAWINGS

FIG. 1 is a schematic lengthwise cross-section of a unidirectionally solidified ingot of a monocarbide reinforced superalloy eutectic illustraing the terminology commonly used with respect to such ingots;

FIG. 2 is a graph of fraction solidified ($g_t$) where surface carbides end versus the atomic percent columbium to tantalum ratio;

DETAILED DESCRIPTION OF THE INVENTION

Figure 3:
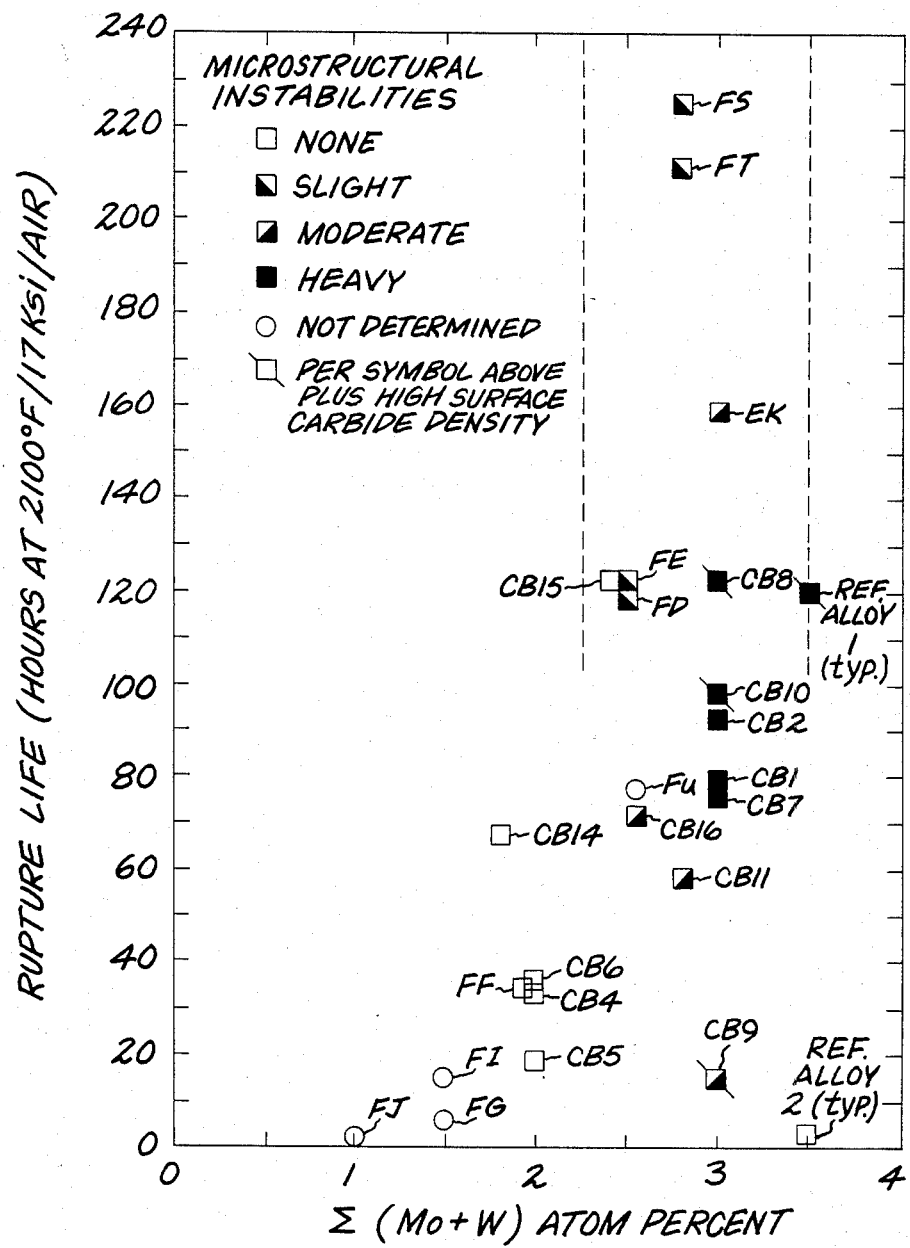
FIG. 3 is a graph of stress-rupture life for specimens tested at 2100° F. and 17 ksi in air versus the atomic percent sum of molybdenum plus tungsten.

The alloys listed in Tables I and II (in atomic and weight percentages, respectively) were melted and directionally solidified (DS'd) at a rate of ¼ inch/hour (0.63 cm/hr) as ½ inch (1.3 cm) or ⅞ inch (2.2 cm) diameter bars for the measurement of on-axis (longitudinal) properties. Selected alloys were DS'd at the same rate in the form of slabs measuring 3/10 inch (0.8 cm) in thickness × 1½ inch (3.8 cm) in width × 4 inches (10.2 cm) in length to provide specimens for the measurement of off-axis (transverse) properties (all bar and slab dimensions approximate). Reference Alloy 1 corresponds to the most preferred alloy of U.S. Pat. No. 4,292,076 and Reference Alloy 2 corresponds to an alloy known to those familiar with the high temperature gas turbine engine materials technology arts as Rene' 125.

TABLE I

| | COMPOSITIONS OF ALLOYS[1,2] | | | | | | | | | | | | |
|---|---|---|---|---|---|---|---|---|---|---|---|---|---|
| | Co | Cr | Mo | W | Re | Al | V | Cb | Ta | C | B | W+Mo | Cb/Ta | $\rho^3$ (gm/cm$^3$) |
| | | | | | | (atom percents) | | | | | | | | |
| Ref. 1 | 4.1 | 4.7 | 2.0 | 1.5 | 2.2 | 12.6 | 0 | 0 | 4 | 2.28 | 0.06 | 3.5 | 0 | 8.639 |
| Ref. 2[4] | 10.1 | 10.2 | 1.2 | 2.3 | 0 | 10.6 | 0 | 0 | 1.3 | 0.5 | 0.08 | 3.5 | 0 | 8.533 |
| CB1 | 3.0 | 6.0 | 2.0 | 1.0 | 2.3 | 13.0 | 0 | 2.0 | 1.0 | 2.0 | 0.11 | 3.0 | 2.0 | 8.327 |
| CB2 | 3.0 | 6.0 | 2.0 | 1.0 | 2.3 | 13.0 | 0 | 2.4 | 1.2 | 1.8 | 0.11 | 3.0 | 2.0 | 8.353 |
| CB3[5] | 3.0 | 6.0 | 2.0 | 1.0 | 2.3 | 13.0 | 0 | 2.8 | 1.4 | 1.5 | 0.11 | 3.0 | 2.0 | 8.387 |
| CB4 | 3.0 | 6.0 | 1.0 | 1.0 | 2.3 | 13.0 | 2.0 | 1.2 | 0.8 | 2.0 | 0.11 | 2.0 | 1.5 | 8.246 |
| CB5 | 3.0 | 6.0 | 1.0 | 1.0 | 2.3 | 13.0 | 2.0 | 1.5 | 1.0 | 1.8 | 0.11 | 2.0 | 1.5 | 8.214 |
| CB6 | 3.0 | 6.0 | 1.0 | 1.0 | 2.3 | 13.0 | 2.0 | 1.8 | 1.2 | 1.5 | 0.11 | 2.0 | 1.5 | 8.174 |
| CB7 | 3.0 | 6.0 | 2.0 | 1.0 | 2.3 | 13.0 | 0 | 2.9 | 0.7 | 1.8 | 0.11 | 3.0 | 4.1 | 8.312 |
| CB8 | 3.0 | 6.0 | 2.0 | 1.0 | 2.3 | 13.0 | 0 | 3.2 | 0.4 | 1.8 | 0.11 | 3.0 | 8.0 | 8.288 |
| CB9 | 3.0 | 6.0 | 2.0 | 1.0 | 2.3 | 13.0 | 0 | 3.4 | 0.2 | 1.8 | 0.11 | 3.0 | 17.0 | 8.271 |
| CB10 | 3.0 | 6.0 | 2.0 | 1.0 | 2.3 | 13.0 | 0 | 3.6 | 0 | 1.8 | 0.11 | 3.0 | ∞ | 8.255 |
| CB11[6] | 3.0 | 6.0 | 1.0 | 1.8 | 2.3 | 12.6 | 0 | 3.2 | 0.8 | 1.8 | 0.11 | 2.8 | 4.0 | 8.414 |
| CB14[6] | 3.0 | 5.0 | 0 | 1.8 | 2.1 | 13.0 | 0.4 | 3.6 | 0.9 | 2.25 | 0.11 | 1.8 | 4.0 | 8.333 |
| CB15 | 4.0 | 5.0 | 1.6 | 0.8 | 2.3 | 13.0 | 0.8 | 2.6 | 0.6 | 2.0 | 0.11 | 2.4 | 4.3 | 8.262 |
| CB16 | 8.0 | 4.0 | 1.6 | 1.0 | 2.3 | 13.2 | 0 | 2.9 | 0.7 | 1.8 | 0.11 | 2.6 | 4.1 | 8.256 |
| CB17 | 8.0 | 4.0 | 1.4 | 1.2 | 2.3 | 13.2 | 0 | 2.9 | 0.7 | 1.8 | 0.11 | 2.6 | 4.1 | 8.274 |
| CB19 | 8.5 | 4.0 | 1.4 | 0.7 | 2.3 | 13.0 | 0 | 3.0 | 1.0 | 1.8 | 0.11 | 2.1 | 3.0 | 8.250 |
| CB20 | 8.0 | 5.0 | 1.6 | 0.8 | 2.3 | 13.0 | 0 | 3.2 | 0.8 | 2.0 | 0.11 | 2.4 | 4.0 | 8.217 |
| CB21 | 8.0 | 5.0 | 1.6 | 0.8 | 2.3 | 12.6 | 0 | 3.2 | 0.8 | 2.0 | 0.11 | 2.4 | 4.0 | 8.242 |
| EK | 4.1 | 4.7 | 1.5 | 1.5 | 2.2 | 12.6 | 0 | 3.0 | 1.0 | 2.28 | 0.06 | 3.0 | 3.0 | 8.387 |
| FD | 4.1 | 4.7 | 1.5 | 1.0 | 2.2 | 12.6 | 0 | 3.0 | 1.0 | 2.28 | 0.06 | 2.5 | 3.0 | 8.335 |
| FE | 4.1 | 4.7 | 1.0 | 1.5 | 2.2 | 12.6 | 0 | 3.0 | 1.0 | 2.28 | 0.06 | 2.5 | 3.0 | 8.380 |
| FF | 4.1 | 4.7 | 1.0 | 1.0 | 2.2 | 12.6 | 0 | 3.0 | 1.0 | 2.28 | 0.06 | 2.0 | 3.0 | 8.332 |
| FG | 4.1 | 4.7 | 1.0 | 0.5 | 2.2 | 12.6 | 0 | 3.0 | 1.0 | 2.28 | 0.06 | 1.5 | 3.0 | 8.276 |
| FI | 4.1 | 4.7 | 0.5 | 1.0 | 2.2 | 12.6 | 0 | 3.0 | 1.0 | 2.28 | 0.06 | 1.5 | 3.0 | 8.321 |
| FJ | 4.1 | 4.7 | 0 | 1.0 | 2.2 | 12.6 | 0 | 3.0 | 1.0 | 2.28 | 0.06 | 1.0 | 3.0 | 8.315 |
| FS | 4.1 | 4.7 | 1.7 | 1.1 | 2.2 | 12.6 | 0 | 3.0 | 1.0 | 2.28 | 0.06 | 2.8 | 3.0 | 8.348 |
| FT | 4.1 | 4.7 | 1.3 | 1.5 | 2.2 | 12.6 | 0 | 3.0 | 1.0 | 2.28 | 0.06 | 2.8 | 3.0 | 8.384 |

TABLE I-continued

| | COMPOSITIONS OF ALLOYS[1,2] | | | | | | | | | | | | |
|---|---|---|---|---|---|---|---|---|---|---|---|---|---|
| | Co | Cr | Mo | W | Re | Al | V | Cb | Ta | C | B | W+Mo | Cb/Ta | $\rho$[3] (gm/cm$^3$) |
| | | | | | | (atom percents) | | | | | | | |
| FU | 4.1 | 4.7 | 1.2 | 1.4 | 2.0 | 12.6 | 0.8 | 2.7 | 0.9 | 2.28 | 0.06 | 2.6 | 3.0 | 8.321 |

[1]Balance nickel plus incidental impurities
[2]Melting specification
[3]Calculated
[4]Alloy also contains 3.1 a/o Ti, 0.5 a/o Hf, and .03 a/o Zr
[5]Hypoeutectic alloy
[6]Alloy also contains 0.034 a/o Hf

TABLE II

| | COMPOSITIONS OF ALLOYS[1,2] | | | | | | | | | | | | |
|---|---|---|---|---|---|---|---|---|---|---|---|---|---|
| | Co | Cr | Mo | W | Re | Al | V | Cb | Ta | C | B | W+Mo | Cb/Ta |
| | | | | | | (weight percents) | | | | | | | |
| Ref. 1 | 3.8 | 3.8 | 3.0 | 4.3 | 6.4 | 5.3 | 0 | 0 | 11.4 | 0.43 | 0.01 | 7.3 | 0 |
| Ref. 2[3] | 10.0 | 8.9 | 2.0 | 7.0 | 0 | 4.8 | 0 | 0 | 3.8 | 0.11 | 0.02 | 9.0 | 0 |
| CB1 | 2.9 | 5.2 | 3.2 | 3.1 | 7.1 | 5.8 | 0 | 3.1 | 3.0 | 0.40 | 0.02 | 6.3 | 1.0 |
| CB2 | 2.9 | 5.2 | 3.2 | 3.0 | 7.1 | 5.8 | 0 | 3.7 | 3.6 | 0.36 | 0.02 | 6.2 | 1.0 |
| CB3[4] | 2.9 | 5.1 | 3.1 | 3.0 | 7.0 | 5.8 | 0 | 4.3 | 4.2 | 0.30 | 0.02 | 6.1 | 1.0 |
| CB4 | 3.0 | 5.3 | 1.6 | 3.1 | 7.3 | 6.0 | 1.7 | 1.9 | 2.5 | 0.41 | 0.02 | 4.7 | 0.8 |
| CB5 | 3.0 | 5.3 | 1.6 | 3.1 | 7.3 | 5.9 | 1.7 | 2.4 | 3.1 | 0.55 | 0.02 | 4.7 | 0.8 |
| CB6 | 3.0 | 5.3 | 1.6 | 3.1 | 7.3 | 6.0 | 1.7 | 2.8 | 3.7 | 0.71 | 0.02 | 4.7 | 0.8 |
| CB7 | 2.9 | 5.2 | 3.2 | 3.1 | 7.1 | 5.8 | 0 | 4.5 | 2.2 | 0.36 | 0.02 | 6.3 | 2.0 |
| CB8 | 3.0 | 5.2 | 3.2 | 3.1 | 7.2 | 5.9 | 0 | 5.0 | 1.2 | 0.36 | 0.02 | 6.3 | 4.2 |
| CB9 | 3.0 | 5.2 | 3.2 | 3.1 | 7.2 | 5.9 | 0 | 5.3 | 0.6 | 0.36 | 0.02 | 6.3 | 8.8 |
| CB10 | 3.0 | 5.2 | 3.2 | 3.1 | 7.2 | 5.9 | 0 | 5.6 | 0 | 0.36 | 0.02 | 6.3 | ∞ |
| CB11[5] | 3.9 | 5.1 | 1.6 | 5.4 | 7.0 | 5.6 | 0 | 4.9 | 2.4 | 0.35 | 0.02 | 7.0 | 2.0 |
| CB14[5] | 2.9 | 4.3 | 0 | 5.5 | 6.5 | 5.8 | 0.34 | 5.5 | 2.7 | 0.45 | 0.02 | 5.5 | 2.0 |
| CB15 | 4.0 | 4.4 | 2.6 | 2.5 | 7.2 | 5.9 | 0.7 | 4.0 | 2.0 | 0.40 | 0.02 | 5.1 | 2.0 |
| CB16 | 7.9 | 3.5 | 2.6 | 3.1 | 7.1 | 5.9 | 0 | 4.5 | 2.1 | .36 | .02 | 5.7 | 2.1 |
| CB17 | 7.8 | 3.5 | 2.2 | 3.7 | 7.1 | 5.9 | 0 | 4.5 | 2.1 | .36 | .02 | 5.9 | 2.1 |
| CB19 | 8.4 | 3.5 | 2.2 | 2.1 | 7.1 | 5.8 | 0 | 4.6 | 3.0 | .36 | .02 | 4.3 | 1.5 |
| CB20 | 7.9 | 4.3 | 2.6 | 2.5 | 7.2 | 5.9 | 0 | 5.0 | 2.4 | .40 | .02 | 5.1 | 2.1 |
| CB21 | 7.9 | 4.3 | 2.6 | 2.5 | 7.1 | 5.7 | 0 | 5.0 | 2.4 | 0.40 | 0.02 | 5.1 | 2.1 |
| EK | 4.0 | 4.0 | 2.4 | 4.5 | 6.7 | 5.6 | 0 | 4.6 | 3.0 | 0.45 | 0.01 | 6.9 | 1.5 |
| FD | 4.0 | 4.1 | 2.4 | 3.1 | 6.8 | 5.7 | 0 | 4.6 | 3.0 | 0.46 | 0.01 | 5.5 | 1.5 |
| FE | 4.0 | 4.0 | 1.6 | 4.6 | 6.8 | 5.7 | 0 | 4.7 | 3.0 | 0.46 | 0.01 | 6.2 | 1.6 |
| FF | 4.0 | 3.9 | 1.6 | 3.1 | 6.8 | 5.7 | 0 | 4.7 | 3.0 | 0.46 | 0.01 | 4.7 | 1.6 |
| FG | 4.1 | 4.1 | 1.6 | 1.6 | 6.9 | 5.7 | 0 | 4.7 | 3.1 | 0.46 | 0.01 | 3.2 | 1.5 |
| FI | 4.0 | 4.1 | 0.8 | 3.1 | 6.9 | 5.7 | 0 | 4.7 | 3.0 | 0.46 | 0.01 | 3.9 | 1.6 |
| FJ | 4.1 | 4.1 | 0 | 3.1 | 6.9 | 5.7 | 0 | 4.7 | 3.0 | 0.46 | 0.01 | 3.1 | 1.6 |
| FS | 4.0 | 4.1 | 2.7 | 3.4 | 6.8 | 5.6 | 0 | 4.6 | 3.0 | 0.45 | 0.01 | 6.1 | 1.5 |
| FT | 4.0 | 4.0 | 2.0 | 4.5 | 6.8 | 5.6 | 0 | 4.6 | 3.0 | 0.45 | 0.01 | 6.5 | 1.5 |
| FU | 4.0 | 4.1 | 1.8 | 4.2 | 6.3 | 5.7 | 0.7 | 4.2 | 2.7 | 0.46 | 0.01 | 6.0 | 1.6 |

[1]Balance nickel plus incidental impurities
[2]Melting specification
[3]Alloy also contains 1.5 w/o Hf, 0.05 w/o Zr and 2.5 w/o Ti
[4]Hypoeutectic alloy
[5]Alloy also contains 0.10 w/o Hf A longitudinal stripe was polished on the as directionally solidified ingots to enable assessment of microstructural features and fiber alignment. Generally, the ingots made from the Table I alloys had an aligned fibrous microstructure typical of monocarbide reinforced nickel-base superalloy eutectics. The terminology used herein, e.g., sort-out zone length, vis-a-vis the DS'd ingots is detailed in FIG. 1.

Qualitative observations of the presence of surface carbides were made by metallographic investigation of the ingots of the Table I alloys. The ingots were prepared by etching the as-cast ingots in an aqueous solution of hydrochloric acid plus hydrogen peroxide to clean the surface and accentuate the presence of the carbides. Measurements were by means of a low power binocular microscope and ruler. In general, the surfaces of the ingots immediately above the sort-out zone were nearly completely covered with carbides in a closely touching relationship. In one series of measurements, the fraction solidified ($g_t$) at which the surface carbides ended, i.e., decreased to substantially zero, was determined. In other series of measurements, the $g_t$ at which the high density carbide population ended (about 1 mm of space between adjacent carbides) and the $g_t$ at which the low density carbide population ended (greater than about 5 mm of space between adjacent carbides) were measured. The metallographic observations of surface carbide density are presented in tabular form in Table III. FIG. 2 is a graph of some of the data of Table III whereon the fraction solidifield ($g_t$) at the end of surface carbide formation is presented versus the ratio of the atomatic percent columbium to the atomic percent tantalum present in the alloys.

TABLE III

| | METALLOGRAPHIC OBSERVATIONS | | | |
|---|---|---|---|---|
| ALLOY | $g_t$ at which surface carbides ends | $g_t$ at which high density carbide population ends | $g_t$ at which low density carbide population ends | microstructural instabilities[1] |
| Ref. 1 (typical) | >0.7 | >0.7 | | Heavy |
| Ref. 2 | — | | | None |

TABLE III-continued

METALLOGRAPHIC OBSERVATIONS

| ALLOY | $g_f$ at which surface carbides ends | $g_f$ at which high density carbide population ends | $g_f$ at which low density carbide population ends | microstructural instabilities[1] |
|---|---|---|---|---|
| (typical) | | | | |
| CB1 | 0.135 | | | Heavy |
| CB2 | 0.15 | | | Heavy |
| CB3 | 0.34 | | | — |
| CB4 | 0.13 | | | None |
| CB5 | 0.16 | | | None |
| CB6 | — | | | None |
| CB7 | 0.11 | | | Heavy |
| CB8 | 0.25 | | | Heavy |
| CB9 | 0.19 | | | Moderate |
| CB10 | 0.26 | | | Heavy |
| CB11 | 0.12 | 0.20 | | Moderate |
| CB14 | 0.01 | 0.80 | | None |
| CB15 | 0.09 | 0.27 | | None |
| CB16 | 0.08 | — | | Moderate |
| CB17 | 0.07 | 0.12 | | — |
| CB19 | 0.04 | 0.12 | | — |
| CB20 | — | — | — | |
| CB21 | — | — | — | |
| EK | — | — | | Moderate |
| FD | 0.45* | 0.50* | | Light |
| FE | 0.15* | 0.35* | | Light |
| FF | | | | None |
| FG | — | — | — | |
| FI | — | — | — | |
| FJ | — | — | — | |
| FS | 0.40 * | >0.7* | | Light |
| FT | 0.35* | >0.7* | | Light |
| FU | 0.20* | 0.30* | | — |

[1]from rupture bars @ >2000° F. with rupture lives >100 hrs.
*From ⅝ inch dia. bars - all others ½ inch dia. bars.

It may be noted from the data of Table III and FIG. 2 that there is a size effect on carbide population which is presently attributed to the differences in the diameters (½″ vs. ⅝″) of the ingots solidified.

Specimen blanks for stress-rupture tests were heat treated prior to final machining and testing. For the "E" and "F" series alloys, the "A" heat treatment was used, i.e., solution treatment at 1270° C. for 2 hours followed by a helium quench, first age at 1080° C. for 16 hours followed by a helium quench, and a second age at 900° C. for 16 hours followed by a helium quench. For the "CB" alloy series, the "B" heat treatment, i.e., the "A" heat treatment with the first ageing treatment at 4 hours and no second age, was used. It has been determined separately that the "A" and "B" heat treatments are substantially equivalent, i.e., the shortening of the 1080° C. age with the elimination of the second age does not appreciably alter the stress-rupture properties of the alloys.

The conditions under which the stress-rupture tests were run and the resultant data are shown in Table IV. The data of Table IV for the condition 2100° F./17 ksi/air are graphed on FIG. 3 as a function of the molybdenum plus tungsten alloy content. Pronounced improvement in stress-rupture strength was observed at the higher test temperature of 2100° F. Based on the stress-rupture strengths at 1800° F., it is considered that the improvement in high-temperature stress-rupture properties observed at 2100° F. will persist to as low a temperature as about 1900° F.

Various stress-rupture specimens tested at temperatures greater than 2000° F. with lives greater than 100 hours were sectioned parallel to the longitudinal axis, in the gage length, and examined metallographically for phase stability. The phase stability data are also listed in Table III and are keyed to the stress-rupture data plotted on FIG. 3.

TABLE IV

STRESS RUPTURE LIVES (hours) (Longitudinal)

| TEMP (°F.) | 1560 | 1600 | 1800 | 2000 | 2100 | 2175 | 1652 | 1832 | 2012 |
|---|---|---|---|---|---|---|---|---|---|
| STRESS (ksi) | 80 | 80 | 54 | 26 | 17 | 11 | 70 | 40 | 23.5 |
| ATMOSPHERE | Air | Air | Air | Air | Air | Air | Argon | Argon | Argon |
| Ref. 1 (typical) | 590 | 220 | 90 | 160 | 120 | 120 | | | |
| Ref. 2 (typical) | | | 2.2 | | 2.5 | | | | |
| CB1 | | | 64.0 | | 78.7 | | | | |
| CB2 | | | 73.5 | | 93.3 | | | | |
| CB3 | | | — | | — | | | | |
| CB4 | | | 87.3 | | 32.7 | | | | |
| CB5 | | | 137.7 | | 19.2 | | | | |
| CB6 | | | 94.6 | | 33.3 | | | | |
| CB7 | | | 61.9 | | 75.8 | | | | |
| CB8 | | | 54.2 | | 122.5 | | | | |
| CB9 | | | 45.3 | | 16.0 | | | | |
| CB10 | | | 65.9 | | 98.6 | | | | |
| CB11 | | | 48.8 | | 57.8 | | | | |
| CB14 | | | 43.7 | | 67.0 | | | | |
| CB15 | | | 45.6 | | 122.0 | | | | |
| CB16 | | | 49.6 | | 72.3 | | | | |
| EK | | 60.9 | 55.3 | 136.6 | 158.9 | 252.0 | 289.4 | 923.1 | 1099.6 |
| EK | | | — | | — | | 212.0 | 798.7 | 378.9 |
| FD | | | 40.2 | | 118.8 | | | | 157.1 |
| FE | | | 33.3 | | 119.4 | | | | 274.0 |
| FF | | | 13.9 | | 34.4 | | | | 121.00 |
| FG | | | 7.3 | | 6.1 | | 9.2 | 23.1 | 24.0 |
| FG | | | — | | — | | | | 15.7 |
| FI | | | 5.3 | | 15.2 | | | | 37.7 |
| FJ | | | 0.9 | | 0.1 | | | | 6.7 |
| FS | | 465.6 | 45.9 | 135.5 | 224.5 | 201.5 | | | |
| FT | | | 171.0 | 65.5 | 210.9 | 288.0 | | | |
| FU | | | 49.1 | | 77.0 | | | | |

In Table III, "light" microstructural instability refers to the precipitation of small amounts of platelet-like or globular phases, generally considered to be $M_6C$ and/or $\sigma$, in a $\gamma'$ envelope in some, but not all, grain boundaries. In contrast, in the case of "heavy" precipitation, there was a general and uniform precipitation of plate-like precipitates, determined from measurements on Reference Alloy 1 to be predominantly $M_6C$ with some $\sigma$, throughout the specimen.

Ductility transverse to the longitudinal (growth) axis was assessed by means of transverse tensile tests on specimens cut from the slab-like ingots. The results of the transverse tensile tests are reported in Table V. As is the case for Ref. Alloy 1, the good transverse ductility of alloys FS, FT, and EK is attributed to the presence of boron and upwards to about 0.1 weight percent is similarly considered to be beneficial to the alloys of the present invention. By similar reasoning, hafnium and zirconium may also optionally be included in the alloys of the invention up to about 1.0 weight percent.

Figure 4:
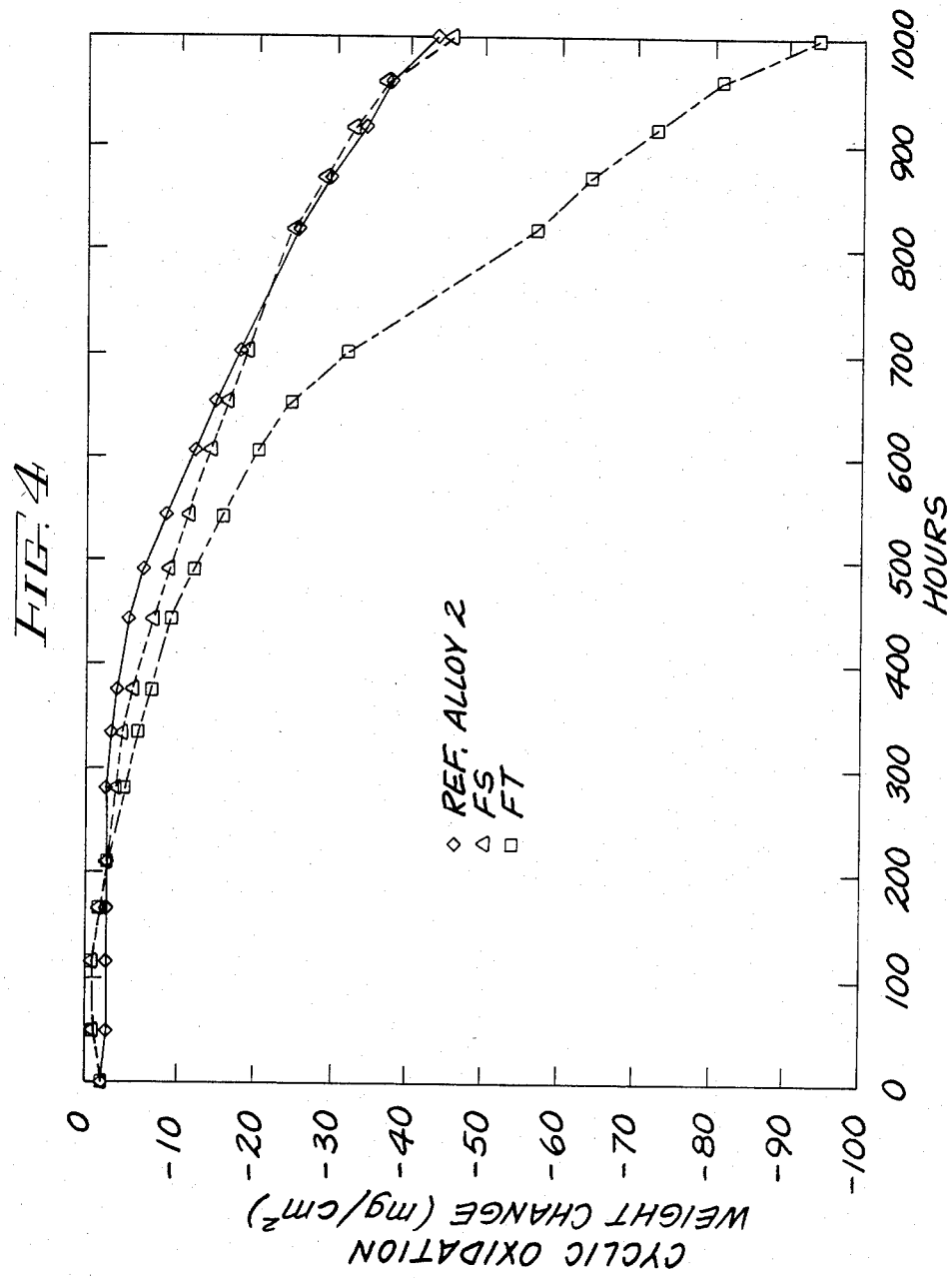
FIG. 4 shows the resistance of alloys FS, FT and Reference Alloy 2 to cyclic oxidation.
Figure 5:
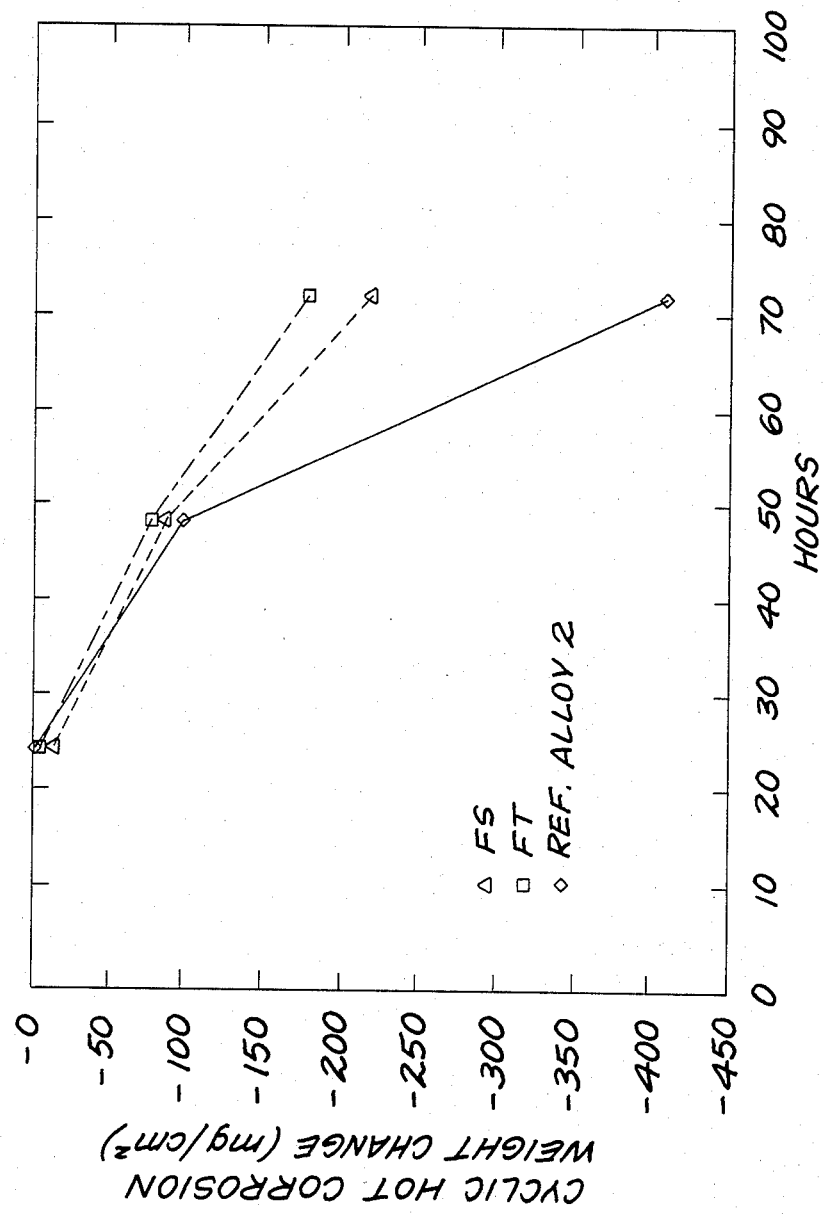
FIG. 5 shows the cyclic hot corrosion resistance of alloys FS, FT and Reference Alloy 2.

Cyclic oxidation and hot corrosion tests were performed on pin-like specimens of experimental alloys FS and FT with the results reported in graphical form in FIGS. 4 and 5, respectively. Pins of Rene' 125, an alloy generally recognized to have very good environmental resistance, were tested at the same time for comparison with the experimental alloys. The oxidation tests were performed by cyclically heating the pins in air to 1100° C., holding for 50 minutes, cooling in still ambient air for 10 minutes and reheating to 1100° C.

TABLE V

| TRANSVERSE TENSILE TESTS | | | |
|---|---|---|---|
| Alloy | Condition | Temp (°F.) | % Elongation at Failure |
| Ref 1 (typical) | As Cast | 1000 | 4.9 |
| | | 1200 | 1.3 |
| | | 1400 | 1.6 |
| | | 1650 | 2.0 |
| | | 1740 | 2.0 |
| | | 1900 | 4.3 |
| FS | As Cast | 1112 | 11.8 |
| | | 1382 | 2.0 |
| | | 1382 | 6.6 |
| | | 1562 | 12.2 |
| | | 1652 | 2.9 |
| | | 1652 | 2.5 |
| | | 1922 | 2.2 |
| FS | Heat Treatment "A" | 1382 | 3.6 |
| | | 1382 | 5.8 |
| | | 1652 | 2.4 |
| | | 1652 | 1.0 |
| | | 1922 | 0.3 |
| FT | As Cast | 1112 | 12.8 |
| | | 1382 | 2.7 |
| | | 1382 | 4.2 |
| | | 1652 | 0.4 |
| | | 1922 | 10.6 |
| EK | As Cast | 1382 | 2.3 |
| | | 1652 | 0.7 |
| | | 1922 | 23.2 |
| CB7 | Heat Treatment "B" | 1382 | 2.1 (minimum ductility) |
| CB11 | Heat Treatment "B" | 1382 | 0.2 (minimum ductility) |
| CB15 | Heat Treatment "B" | 1652 | 1.1 (minimum ductility) |
| CB16 | Heat Treatment "B" | 1922 | ~0 (minimum ductility) |
| CB17 | Heat Treatment "B" | 1922 | ~0 (minimum ductility) |

Cyclic oxidation tests, such as the 1100° C. test just described, have been determined to be a more reliable indicator of oxidation resistance for alloys designed for service in aircraft gas turbine engines than static (constant temperature) oxidation tests. Generally, the results of cyclic oxidation tests cannot be correlated with the results of static oxidation tests. The hot corrosion tests were conducted by cycling the pins to 870° C. for 10 minutes, then to 1000° C. for 10 minutes and then to room temperature for 10 minutes. Every 24 hours an aqueous solution of $Na_2SO_4$ was sprayed on the specimens to provide about 10 mg/cm$^2$ of $Na_2SO_4$ on the surfaces of the specimens.

FIG. 2 shows that the formation of surface carbides may be minimized if the ratio of the atomic percent (a/o) columbium to atomic percent tantalum is maintained within the range of from about 1.5 to 5. In terms of weight percentages (w/o), the range is from about 1 to about 4.5. In converting, the tungsten and molybdenum contents were set at the extrema to yield the lowest and highest Cb/Ta weight ratios, e.g., tungsten equal to 3.5 weight percent and molybdenum at zero weight percent yields the minimum Cb/Ta ratio.

On FIG. 3 there are drawn two dashed vertical lines. The vertical line at about 2.25 a/o (Mo+W) represents the minimum (Mo+W) that must be present in the alloys of the invention to provide acceptable stress-rupture strength. The vertical line at about 3.5 a/o (Mo+W) represents the maximum (Mo+W) that can be present in the alloys of the invention without creating an unacceptable propensity for the formation of microstructural instabilities. Those limits are about 3.4 and 10.4, respectively, in terms of weight percentages.

Prior to converting the minimum and maximum of the range for the sum (Mo+W) of FIG. 3 from atomic percent to weight percent, the atomic percentages corresponding to the minimum (2.25 at.%) and the maximum (3.5 at.%) were minimized and maximized, respectively. For the maximum, for example, molybdenum was set to zero and tungsten to 3.5. Also, the quantity (columbium plus tantalum) and carbon were reduced to levels representing an alloy having a minimized sort-out zone, but below the levels at which there would be matrix sort-out. Within the quantity (Cb+Ta), the Cb/Ta ratio was maximized to the extent allowed by FIG. 2.

Based on the two ranges described above, the new substantially phase stable eutectic superalloys having improved high temperature stress-rupture strength, with improved resistance to the formation of surface nucleated carbides, which are capable of developing in a unidirectionally solidified anisotropic article of manufacture a microstructure comprising a nickel-base superalloy matrix with an aligned fibrous monocarbide eutectic reinforcing phase embedded in the matrix, may be defined as superalloys consisting essentially of tantalum, columbium and carbon; one or more elements selected from the group consisting of chromium, aluminum, cobalt, tungsten, molybdenum, rhenium, vanadium, hafnium, and zirconium; boron in an amount greater than an impurity amount up to about 0.05%, the balance being essentially nickel and incidental impurities, subject to the proviso that, by weight percent, $$3.4 \leq \Sigma(Mo+W) \leq 10.4 \qquad (a)$$

and $$1 \leq (Cb/Ta) \leq 4.5. \qquad (b)$$

By further considering the above-described two ranges and the ranges of the alloying elements of the alloys within the bounds of the vertical dashed lines on FIG. 3 and having rupture lives greater than about 110 hours at 2100° F. and 17 ksi in air without an undesirable propensity for the formation of surface carbides, and by applying reasonable commercial melting tolerances to those ranges of alloying elements, (i.e., ±0.2 w/o for Co, Cr, Mo, Al and Cb; ±0.3 w/o for W, Re and V; ±0.4 w/o for Ta; ±0.08 w/o for C; and ±0.005 w/o for B) the novel eutectic superalloys of the invention can further be specified as consisting essentially of, by weight, 3.8–4.2% cobalt, 3.8–4.6% chromium, 1.4–2.9% molybdenum, 2.2–4.9% tungsten, 6.4–7.5% rhenium, 5.4–6.1% aluminum, 0–1.4% vanadium, 2.7–6.0% columbium, 0.8–4.1% tantalum, 0.17–0.75% carbon, boron in an amount greater than an impurity amount to about 0.05%, the balance being essentially nickel and incidental impurities, subject to the provisos that, by weight percent, $$3.6 \leq \Sigma(Mo+W) \leq 7.8 \quad (a)$$

and $$1 \leq (Cb/Ta) \leq 4.5. \quad (b)$$

In arriving at the above statement of the superalloys of the invention, the melting-tolerance-expanded ranges were further expanded for the elements V, Cb, Ta, and C to include compositions which would be obtained if a once-DS'd ingot were severed at a location just above the sort-out zone and DS'd again. In similar fashion, by considering just the ranges of the alloying elements for alloys FS, FT and EK, and applying the melting tolerances and the expanded ranges for the elements V, Cb, Ta, and C, the novel eutectic superalloys of the instant invention may be further characterized as consisting essentially of about, by weight 3.8–4.2% cobalt, 3.8–4.3% chromium, 1.8–2.9% molybdenum, 3.1–4.8% tungsten, 6.4–7.1% rhenium, 5.4–5.8% aluminum, 2.7–6.0% columbium, 0.8–4.1% tantalum, 0.17–0.75% carbon, 0.001–0.05% boron, the balance being essentially nickel and incidental impurities.

What is claimed is:

1. A unidirectionally solidified anisotropic composite article of manufacturing having improved high temperature stress-rupture strength with improved resistance to the formation of surface nucleated carbides comprising:
    (a) a nickel-base superalloys matrix and
    (b) an aligned fibrous monocarbide eutectic reinforcing phase embedded in said matrix,
said article being of a substantially phase stable alloy consisting essentially of tantalum, columbium and carbon; one or more elements selected from the group consisting of chromium, aluminum, cobalt, tungsten, molybdenum, rhenium, vanadium, hafnium, and zirconium; boron in an amount greater than an impurity amount up to about 0.05%, the balance being essentially nickel and incidental impurities, subject to the provisos that, by weight percent, $$3.4 \leq (Mo+W) \leq 10.4 \quad (i)$$

and $$1 \leq (Cb/Ta) \leq 4.5. \quad (ii)$$

2. A unidirectionally solidified anisotropic composite metallic article of manufacture having improved high temperature stress-rupture strength with improved resistance to the formation of surface nucleated carbides comprising:
    (a) a nickel-base superalloy matrix, and
    (b) an aligned fibrous monocarbide eutectic reinforcing phase embedded in said matrix, said article being of a substantially phase stable alloy consisting essentially of, by weight, 3.8–4.2% cobalt, 3.8–4.6% chromium, 1.4–2.9% molybdenum, 2.2–4.9% tungsten, 6.4–7.5% rhenium, 5.4–6.1% aluminum, 0–1.4% vanadium, 2.7–6.0% columbium, 0.8–4.1% tantalum, 0.17–0.75% carbon, boron in an amount greater than an impurity amount to about 0.05%, the balance being essentially nickel and incidental impurities, subject to the provisos that, by weight percent, $$3.6 \leq \Sigma(Mo+W) \leq 7.8 \quad (i)$$

and $$1 \leq (Cb/Ta) \leq 4.5. \quad (ii)$$

3. The claim 2 article consisting essentially of about, by weight, 3.5–4.2% cobalt, 3.8–4.3% chromium, 1.8–2.9% molybdenum, 3.1–4.8% tungsten, 6.4–7.1% rhenium, 5.4–5.8% aluminum, 2.7–6.0% columbium, 0.8–4.1% tantalum, 0.17–0.75% carbon, 0.001–0.05% boron, the balance being essentially nickel and incidental impurities.

4. The claim 2 article consisting essentially of about, by weight, 3.8–4.2% cobalt, 3.8–4.2% chromium, 2.2–2.6% molybdenum, 4.2–4.8% tungsten, 6.4–7.0% rhenium, 5.4–5.8% aluminum, 4.2–4.8% columbium, 2.6–3.4% tantalum, 0.37–0.53% carbon, 0.001–0.02% boron, the balance being essentially nickel and incidental impurities.

5. The claim 2 article consisting essentially of about, by weight, 3.8–4.2% cobalt, 3.9–4.3% chromium, 2.5–2.9% molybdenum, 3.1–3.7% tungsten, 6.5–7.1% rhenium, 5.4–5.8% aluminum, 4.2–4.8% columbium, 2.6–3.4% tantalum, 0.37–0.53% carbon, 0.001–0.02% boron. the balance being essentially nickel and incidental impurities.

6. The claim 2 article consisting essentially of about, by weight, 3.8–4.2% cobalt, 3.8–4.2% chromium, 1.8–2.2% molybdenum, 4.2–4.8% tungsten, 6.5–7.1% rhenium, 5.4–5.8% aluminum, 4.2–4.8% columbium, 2.6–3.4% tantalum, 0.37–0.53% carbon, 0.001–0.02% boron, the balance being essentially nickel and incidental impurities.

* * * * *

UNITED STATES PATENT AND TRADEMARK OFFICE
CERTIFICATE OF CORRECTION

PATENT NO. : 4,522,664
DATED : June 11, 1985
INVENTOR(S) : Michael F. X. Gigliotti, Jr.; Swe-Wong Yang; Melvin R. Jackson; Charles A. Bruch; Xuan Nguyen-Dinh It is certified that error appears in the above-identified patent and that said Letters Patent is hereby corrected as shown below:

Column 11 (claim 1), line 41, delete "manufacturing" and insert therefor --manufacture--;

Column 11 (claim 1), line 45, delete "superalloys" and insert therefor --superalloy--;

Column 12 (claim 3), line 31, delete "3.5-4.2% cobalt" and insert therefor --3.8-4.2% cobalt--; and Column 12 (claim 5), line 49, delete "boron." and insert therefor --boron,--.

Signed and Sealed this

Twenty-first Day of January 1986

[SEAL]

Attest:

DONALD J. QUIGG

Attesting Officer

Commissioner of Patents and Trademarks